(12) United States Patent
Basol

(10) Patent No.: US 7,854,963 B2
(45) Date of Patent: *Dec. 21, 2010

(54) METHOD AND APPARATUS FOR CONTROLLING COMPOSITION PROFILE OF COPPER INDIUM GALLIUM CHALCOGENIDE LAYERS

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 860 days.

This patent is subject to a terminal disclaimer.

(21) Appl. No.: 11/740,248

(22) Filed: Apr. 25, 2007

(65) Prior Publication Data

US 2008/0096307 A1  Apr. 24, 2008

Related U.S. Application Data

(63) Continuation-in-part of application No. 11/549,590, filed on Oct. 13, 2006, now abandoned.

(60) Provisional application No. 60/865,385, filed on Nov. 10, 2006, provisional application No. 60/862,164, filed on Oct. 19, 2006.

(51) Int. Cl.
*B05D 3/02* (2006.01)
*H01L 21/00* (2006.01)

(52) U.S. Cl. .................. 427/383.1; 438/95; 438/102; 438/104

(58) Field of Classification Search ............. 427/383.1; 438/95, 102, 104
See application file for complete search history.

(56) References Cited

U.S. PATENT DOCUMENTS

| | | | |
|---|---|---|---|
| 4,798,660 A | | 1/1989 | Ermer et al. |
| 5,578,503 A | | 11/1996 | Karg et al. |
| 5,728,231 A | * | 3/1998 | Negami et al. ............ 148/33 |
| 5,935,324 A | * | 8/1999 | Nakagawa et al. ......... 117/106 |
| 6,048,442 A | * | 4/2000 | Kushiya et al. .......... 204/192.28 |

(Continued)

FOREIGN PATENT DOCUMENTS

DE     10006778     2/2000

(Continued)

OTHER PUBLICATIONS

Basol, et al. "Studies on Sulfur diffusion into Cu(in,Ga)Se$_2$ thin films" Progress in Photovoltaics, 8 (2000) pp. 227-235.

(Continued)

*Primary Examiner*—Shamim Ahmed
(74) *Attorney, Agent, or Firm*—Pillsbury Winthrop Shaw Pittman, LLP

(57) ABSTRACT

The present invention relates to method and apparatus for preparing thin films of semiconductor films for radiation detector and photovoltaic applications. In one aspect, the present invention is directed to a method of forming a Cu(In,Ga)(S,Se)$_2$ layer with substantially uniform Ga distribution. In a particular aspect, the method includes depositing a precursor film on the base, the precursor film including Cu, In and Ga, sulfurizing the precursor film thus forming a sulfurized precursor layer with a substantially uniform Ga distribution, and selenizing the sulfurized precursor layer to reduce the sulfur concentration therein and obtain the Cu(In,Ga)(S,Se)$_2$ layer with substantially uniform Ga distribution. In a further aspect, the method also includes the step of selenizing the precursor film.

22 Claims, 3 Drawing Sheets

U.S. PATENT DOCUMENTS

| 6,092,669 | A * | 7/2000 | Kushiya et al. ........ 204/298.13 |
| 6,207,219 | B1 | 3/2001 | Ikeya et al. |
| 6,753,272 | B1 | 6/2004 | Lee et al. |
| 7,582,506 | B2 * | 9/2009 | Basol .......................... 438/95 |
| 2007/0111367 | A1 | 5/2007 | Basol et al. |
| 2007/0257255 | A1 * | 11/2007 | Dhere et al. .................. 257/40 |

OTHER PUBLICATIONS

Ganchev, et al. "Preparation of Cu(in,Ga) Se$_2$ layers by selenization of electrodeposited Cu-In-Ga precursors" Thin Solid Films (2006) pp. 325-327.

Hanket et al., Composition control in the growth of Cu(InGa)(SeS)$_2$ by the reaction of Cu-In-Ga precursors in H$_2$Se and H$_2$S, IEEE (2006) pp. 560-563.

Assali, K.E., et al., "Initial Results of CdS/CuInTe2 Heterojunction Formed by Flash Evaporation", *Solar Energy Mats & Solar Cells*, vol. 59, 1999, pp. 349-353.

Basol, B., et al., "Control of CuInSe2 Film Quality by Substrate Surface modifications in a Two Stage Process", *IEEE*, 1991, pp. 1179-1184.

Basol, B., et al., "Cu(In,Ga)Se2 Thin Films and Solar Cells Prepared by Selenization of Metallic Precursor", *J. Vac. Sci. Technol.*, vol. 14, No. 4, Jul./Aug. 1996, pp. 2251-2256.

Boustani, M., et al., "Structural and Optical Properties of CuInTe2 Films Prepared by Thermal Vacuum Evaporation from a Single Source", *Solar Energy Mats. And Solar Cells*, vol. 45, 1997, pp. 369-376.

Marudachalam, M., et al., "Preparation of homogeneous Cu(InGA)Se2 Films by Selenization of Metal Precursors in H2He Atomosphere", *Appl. Phys. Lett.*, vol. 67, No. 26, Dec. 25, 1995, pp. 3978-3980.

Reddy, M.S., et al., "Investigations on Polycrystalline CuGaTe2 Thin Films", *Thin Solid Films*, vol. 292, 1997, pp. 14-19.

Roy, S., et al., "CuInTe2 Thin Films Synthesized by Graphite Box Annealing of In/Cu/Te Stacked Elemental Layers", *Vacuum*, vol. 65, 2002, pp. 27-37.

Abou-Elfotouh, Fa, et al., "Studies of the Electrical and Interface Properties of the Metal Contacts to CuInSe$_2$ Single Crystals", *J. Vac. Sci. Technol. A.*, 8(4), Jul./Aug. 1990, pp. 3251-3254.

Bhattacharya, R.N., et al., "CuIn$_{1-x}$Ga$_x$Se$_2$-based Photovoltaic Cells from Electrodeposited Precursor Films", *Solar Energy Mats & Solar Cells*, vol. 76, 2003, pp. 331-337.

Binsma, J.J., et al., "Preparation of Thin CuInS$_2$ Films via a Two Stage Process", *Thin Solid Films*, 97, 1982, pp. 237-243.

Calixto, M.E., et al., "CuInSe$_2$ Thin Films Formed by Selenization of Cu-In Precursors", *J. of Mats. Sci.*, 33, 1998, pp. 339-345.

Dey, S., et al., "Platinum Group Metal Chalcogenides", *Platinum Metals Rev.*, 48(1), 2004, pp. 16-29.

Fernandez, et al., "Electrodeposited and Selenized (CuInSe$_2$) (CIS) Thin Films for Photovoltaic Applications", *Solar Energy Materials and Solar Cells*, 52, 1998, pp. 423-431.

Friedfeld, R., et al., "Electrodeposition of CuIn$_x$Ga$_{1-x}$Se$_2$ Thin Films", *Solar Energy Mats. & Solar Cells*, 58, 1999, pp. 375-385.

Fritz, H.P., et al., "A New Electrochemical Method for Selenization of Stacked CuIn Layers and Preparation of CuInSe$_2$ by Thermal Annealing", *Thin Solid Films*, 247, 1994, pp. 129-133.

Gabor, et al., "CInSe2 Thin Film Formation by Rapid Annealing of the Elemental Precurso", Americ. Ins. Of Phys., pp. 236-242, (1992).

Ghosh, B., et al., "A Novel Back-Contacting Technology for CuInSe$_2$ Thin Films", *Semiconduct. Sci. Tech.*, 11, 1996, pp. 1358-1362.

Grindle, S.P., et al., "Preparation and Properties of CuInS$_2$ Think Films Produced by Exposing rf-Sputtered Cu-In Films to an H$_2$S Atmosphere", *Appl. Phys. Lett*, 35(1) Jul. 1, 1979, pp. 24-26.

Guillen, C., et al., "New Approaches to Obtain CuIn$_{1-x}$Ga$_x$Se$_2$ Thin Films by Combining Electrodeposited and Evaporated Precursors", *Thin Solid Films*, 323, 1998, pp. 93-98.

Guillen, C.,et al., "CuInSe$_2$ Thin Films Obtained by a Novel Electrodeposition and Sputtering Combined Method," *Vacuum*, 58, 2000, pp. 594-601.

Gupta, A., et al., "CuInS$_2$ Films Prepared by Sulfurization of Electroless Deposited Cu-In Alloy", *Solar Energy Mats.*, 18, 1988, pp. 1-8.

Huang, C.J., et al., "formation of CuInSe$_2$ Thin Films on Flexible Substrates by Electrodeposition (ED) Technique", *Solar Energy Mats. & Solar Cells*, 82, 2004, pp. 553-565.

Kadam, A., et al., "Study of Molybdenum Back Contact Layer to Achieve Adherent and Efficient CIGS2 Absorber Thin-Film Solar Cells", *J. Vac. Sci. Tech. A.*, 23(4), Jul./Aug. 2005, pp. 1197-1201.

Kampmann, A., et al., "Electrodeposition of CIGS on Metal Substrates", *Mat. Res. Soc. Symp. Proc.*, 763, 2003, pp. B8.5.1-B8.5.6.

Kapur, V.K., et al., "Low Cost Thin Film Chalcopyrite Solar Cells", *IEEE*, 1985, p. 1429-1432.

Kapur, V.K., et al., "Low Cost Methods for the Production of Semiconductor Films for CuInSe$_2$ /CdS Solar Cells", *Solar Cells*, 21, 1987, pp. 65-72.

Kim, et al., "Preparation of CuInSe$_2$ Thin Films Using Electrodeposited In/Cu Metallic Layer", *First WCPEC*, Dec. 5-9, 1994, Hawaii, *IEEE*, pp. 202-205.

Kumar, et al., "Properties of CuInSe$_2$ Films Prepared by the Rapid Thermal Annealing Technique", *Thin Solid Films*, 223, 1993, pp. 109-113.

Kerr, et al., "Rapid Thermal Processing of CIS Precursors", IEEE, pp. 676-679, (2002).

Lokhande, C., et al., "Preparation of CuInSe$_2$ and CuInS$_2$ Films by Reactive Annealing in H$_2$ Se$_2$ or H$_2$ S", *Solar Cells,*, 21, 1987, pp. 215-224.

Malmstrom, J., et al., "Enhanced Back Reflectance and Quantum Efficiency in Cu(In,Ga) H$_2$ Se$_2$ Thin Film Solar Cells with ZrN Back Reflector", *Appl. Phys. Letts.*, 85(13), Sep. 27, 2004, pp. 2634-2636.

Mooney, et al., "The formation of CuInSe2 Thin Films by Rapid ThermalProcessing", Solar Cell, vol. 30, pp. 69-77, (1991).

Moons, E., et al., "Ohmic Contacts to P-CuInSe$_2$ Crystals", *J. of Electron. Mats.*, 22(3), 1993, pp. 275-280.

Nelson, A., et al., "Formation of Schottky Barrier Height of Au Contacts to CuInSe$_2$ ", *J. Vac. Sci. Technol. A.*, 9(3), May/Jun. 1991, pp. 978-982.

Pendorff, et al., "CuInS2 Thin Film Formation on a Cu Tape Substrate for Photovoltaic Applications", Solar Energy Materials and Solar Cells, vol. 53, pp. 285-298 (1998).

Probst, et al., "Advanced Stacked Elemental Layer Process for Cu(InGa)Se2 Thin Film Photovoltaic Devices", MRS Symp. Proc., vol. 426, pp. 165-176, (1996).

Winkler, M., et al. "CISCuT absorber layers—the present model of thin film growth", Thin Solid Films 387 (2001) p. 86-88.

Winkler, et al., "Design Actual Performance and Electrical Stability of CISCuT-Based Quasi Endless Solar Cell Tapes", Mat. Res. Soc. Symp. Proc., vol. 668, pp. H3.11-H311.6, (2001).

\* cited by examiner

METHOD AND APPARATUS FOR CONTROLLING COMPOSITION PROFILE OF COPPER INDIUM GALLIUM CHALCOGENIDE LAYERS

CLAIM OF PRIORITY

This application claims priority to U.S. Provisional Appln. Ser. No. 60/862,164 filed Oct. 19, 2006 entitled "Roll-To-Roll Electroplating For Photovoltaic Film Manufacturing", U.S. Provisional Appln. Ser. No. 60/865,385 filed Nov. 10, 2006 entitled "Reel-To-Reel Reaction of Precursor Film to Form Solar Cell Absorber", and U.S. patent application Ser. No. 11/549,590 filed Oct. 13, 2006 now abandoned entitled "Method and Apparatus For Converting Precursor Layers Into Photovoltaic Absorbers" and expressly incorporates each of these applications by reference herein.

FIELD OF THE INVENTION

The present invention relates to method and apparatus for preparing thin films of semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors including some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which includes a material in the family of $Cu(In,Ga,Al)(S,Se,Te)_2$, is grown over a conductive layer 13 or contact layer, which is previously deposited on the substrate 11 and which acts as the electrical contact to the device. The substrate 11 and the conductive layer 13 form a base 13A on which the absorber film 12 is formed. Various conductive layers including Mo, Ta, W, Ti, and stainless steel etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO or CdS/ZnO etc. stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

If there is more than one Group VIA material or element in the compound, the electronic and optical properties of the Group IBIIIAVIA compound are also a function of the relative amounts of the Group VIA elements. For $Cu(In,Ga)(S,Se)_2$, for example, compound properties, such as resistivity, optical bandgap, minority carrier lifetime, mobility etc., depend on the Se/(S+Se) ratio as well as the previously mentioned Cu/(In+Ga) and Ga/(Ga+In) molar ratios. Consequently, solar-to-electricity conversion efficiency of a CIGS(S)-based solar cell depends on the distribution profiles of Cu, In, Ga, Se and S through the thickness of the CIGS(S) absorber. For example, curve A in FIG. 2 schematically shows a typical distribution profile for the Ga/(Ga+In) molar ratio for a $Cu(In,Ga)Se_2$ absorber layer formed by a two-stage process involving selenization of metallic precursors including Cu, In and Ga. Examples of such two-stage processes may be found in various publications. For example, U.S. Pat. No. 6,048,442 discloses a method including sputter-depositing a stacked precursor film containing a Cu—Ga alloy layer and an In layer to form a Cu—Ga/In stack on a metallic back electrode layer and then reacting this precursor stack film with one of Se and S to form the absorber layer. U.S. Pat. No. 6,092,669 describes the sputtering-based equipment for producing such absorber layers.

Referring back to curve A in FIG. 2, one problem faced with the selenization type processes (also called two-stage processes) is the difficulty to distribute Ga uniformly through the thickness of the absorber layer formed after reaction of metallic precursor film with Se. It is believed that when a metallic precursor film including Cu, In and Ga is deposited first on a base and then reacted with Se, the Ga-rich phases segregate to the film/base interface (or the film/contact interface) because reactions between Ga-bearing species and Se are slower than the reactions between In-bearing species and Se. Therefore, such a process yields compound absorber layers with surfaces that are rich in In and poor in Ga. When a solar cell is fabricated on such an absorber layer, the active junction of the device is formed within the surface region with a low Ga/(Ga+In) ratio as shown by Curve A in FIG. 2. This surface portion is practically a $CuInSe_2$ layer with a small bandgap and consequently solar cells fabricated on such layers display low open circuit voltages (typically 400-500 mV) and thus lower efficiencies. In contrast, curve B in FIG. 2 schematically shows a relatively uniform Ga/(Ga+In) molar ratio distribution. Solar cells fabricated on such absorbers display higher voltage values of typically over 600 mV due to the presence of Ga (typically 20-30%) near the surface region. The world record efficiency of 19.5% was demonstrated on such an absorber obtained by a co-evaporation process. Obtaining similar Ga distribution profiles for absorbers fabricated using two-stage processes is important to increase the performance of such absorbers.

SUMMARY OF THE INVENTION

The present invention relates to method and apparatus for preparing thin films of semiconductor films for radiation detector and photovoltaic applications.

In one aspect, the present invention is directed to a method of forming a $Cu(In,Ga)(S,Se)_2$ layer with substantially uniform Ga distribution.

In a particular aspect, the method includes depositing a precursor film on the base, the precursor film including Cu, In and Ga, sulfurizing the precursor film thus forming a sulfurized precursor layer with a substantially uniform Ga distribution, and selenizing the sulfurized precursor layer to reduce the sulfur concentration therein and obtain the $Cu(In,Ga)(S, Se)_2$ layer with substantially uniform Ga distribution.

In a further aspect, the method also includes the step of selenizing the precursor film.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

Figure 3:
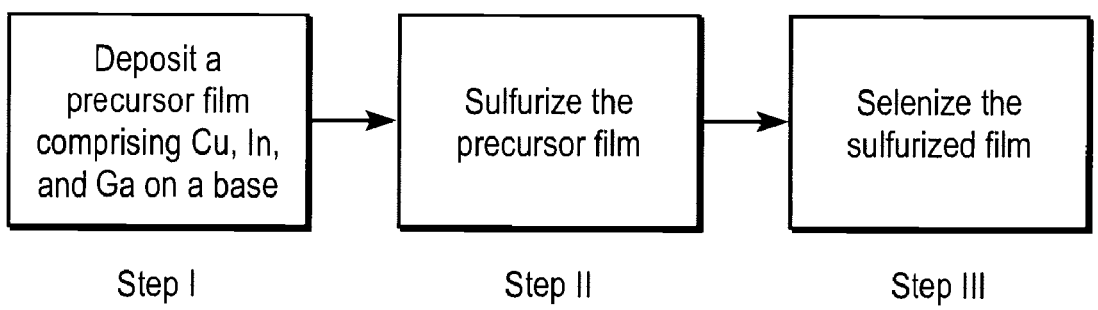
FIG. 3 shows a set of process steps in accordance with one embodiment of the invention.

FIG. 3 shows the process steps for growing a $Cu(In,Ga)Se_2$ absorber layer on a base, wherein the Ga distribution within the absorber layer is substantially uniform. As can be seen from FIG. 3, the first step of the process (Step I) is deposition of a precursor film on a base, the precursor film preferably including Cu, In and Ga. As an example, the amounts of Cu, In and Ga may be such that Cu/(In+Ga) molar ratio in the film may be in the range of 0.7-1.0, preferably in the range of 0.8-0.9, and the Ga/(Ga+In) molar ratio may be in the range of 0.1-0.5, preferably in the range of 0.2-0.35. The precursor film may be deposited on the base by a variety of techniques such as electrodeposition, evaporation, sputtering, ink deposition etc. The precursor film may include nano particles made of Cu and/or In and/or Ga and/or their mixtures and/or alloys. Alternately, the precursor film may include at least two sub-layers, each sublayer including at least one of Cu, In and Ga.

Figure 1:
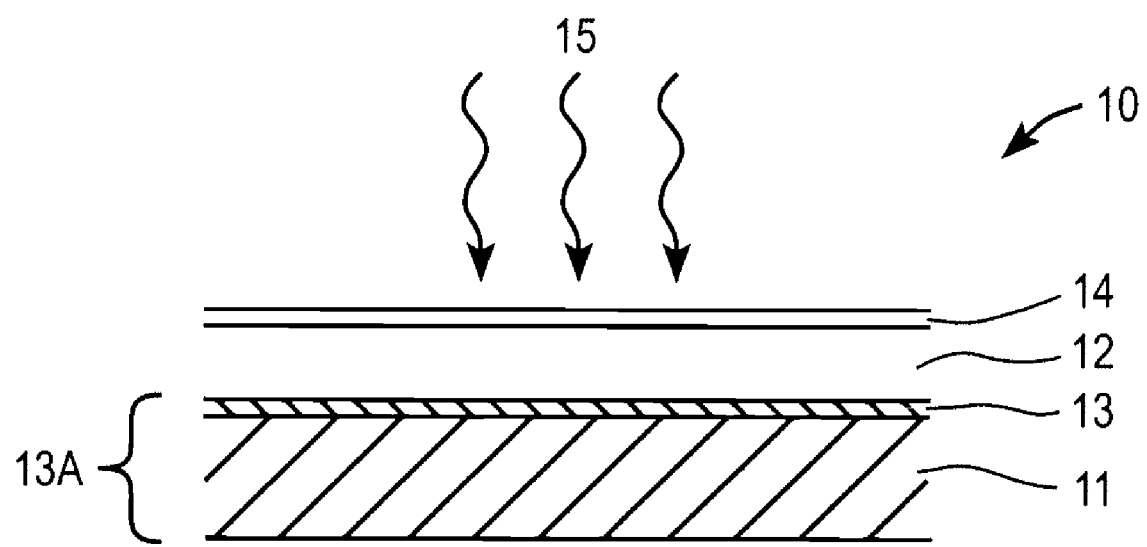
FIG. 1 is a cross-sectional view of a solar cell employing a Group IBIIIAVIA absorber layer.
Figure 2:
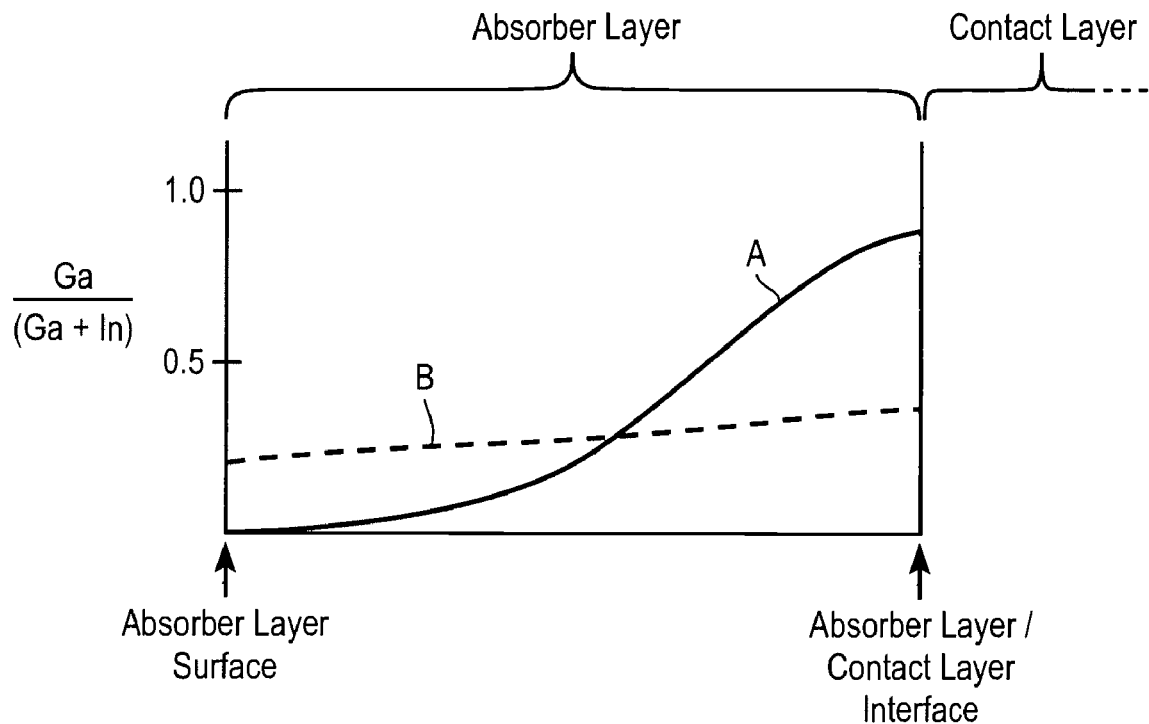
FIG. 2 shows Ga/(Ga+In) molar ratios in two different CIGS absorber layers, one with a Ga-poor surface (curve A) and the other with a more uniform Ga distribution (curve B).

Referring back to FIG. 3, the second step (Step II) of the process involves a reaction step wherein the precursor film is reacted with S species. Such sulfurization or sulfidation reaction may be achieved in various ways. Typically, the reaction step may involve heating the precursor film to a temperature range of 200-600° C. in the presence of S provided by sources such as solid or liquid S, $H_2S$ gas, S vapors, etc., for periods ranging from 1 minute to 1 hour. The S vapor may be generated by heating solid or liquid sources of S or by organometalic S sources, among others. During the reaction with S, Ga species (such as Cu—Ga intermetallics, Ga—S species, Ga—In—S species, Cu—Ga—S species, Cu—In—Ga—S species, etc.) get distributed relatively uniformily (as shown in curve B of FIG. 2) through the reacting precursor layer. This is because reaction of Ga species with S is fast, unlike the reaction of Ga species with Se, which, as described before, is slow. As a result of the Step II of the process a reacted film or a sulfurized film is formed on the base, the reacted film including Cu, In, Ga, and S, wherein the Ga is distributed substantially uniformly through the thickness of the reacted film. It should be noted that the sulfurization of the precursor film may be a complete reaction or an incomplete reaction during this Step 11 of the process. If the reaction is complete, then ternary or quarternary compounds such as $Cu(In,Ga)S_2$ phases would be formed. If the reaction is incomplete, then binary and/or ternary, and/or quarternary phases such as Ga—S, In—S, Ga—In—S, Cu—S, Cu—Ga—S, etc. may form in place of or in addition to the $Cu(In,Ga)S_2$ phases. The important point, however, is the fact that irrespective of the phase content, the Ga distribution in the reacted film is substantially uniform. It should be noted that the precursor film may include Se in addition to Cu, In, and Ga. In this case the amount of Se in the precursor layer is preferably less than 80% of the amount needed to form a $Cu(In,Ga)Se_2$ layer. In other words, the Se/Cu molar ratio in the precursor film is less than or equal to 1.6, preferably less than 1.0. By limiting the amount of Se in the precursor film, it is assured that reaction of Ga and Se species are not complete and that the Ga and S species can react during the Step II of the process and Ga distribution through the film may be achieved.

The last step (Step III) of the process in FIG. 3 is substantial replacement of S in the sulfurized or reacted film with Se. To achieve this, the reacted film of Step II is exposed to Se species at elevated temperatures (selenization), preferably in the range of 250-600° C., more preferably in the range of 400-575° C., for a period of time which may be in the range of 1 minute to 1 hour, preferably in the range of 5 minutes to 30 minutes. As a result of this selenization step (Step III), the sulfurized film is converted into a $Cu(In,Ga)Se_2$ absorber layer while the substantially uniform distribution of Ga within the film is preserved yielding a distribution similar to that shown in curve B of FIG. 2. It should be noted that by adjusting the times and temperatures employed during Step III of the process, certain degree of S may be left in the absorber layer. The S/(S+Se) ratio in the final absorber layer may be less than 0.3, preferably less than 0.2, most preferably less than 0.1. Higher selenization temperatures and/or longer selenization times would replace more of the S within the reacted film with Se, thus yielding smaller S/(S+Se) ratio in the final absorber. The Step III of the present invention utilizes an observation that Se has the capability to replace S when a S containing binary, ternary or quarternary material including at least one of Cu, In and Ga is exposed to Se at elevated temperature.

Figure 4:
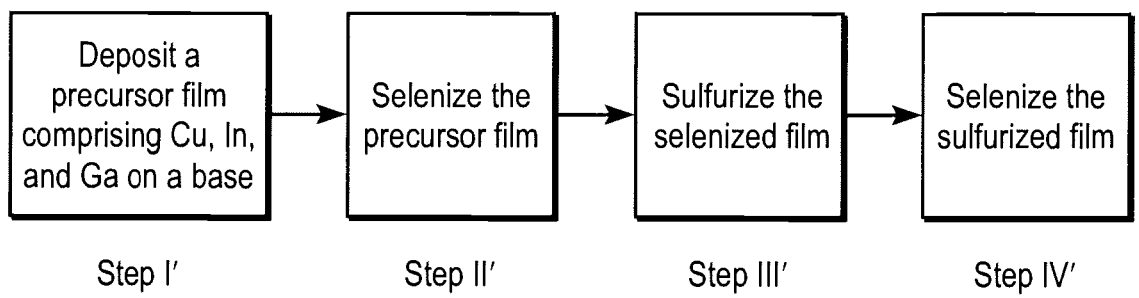
FIG. 4 shows another set of process steps in accordance with another embodiment of the invention.

FIG. 4 shows the process steps of another embodiment that yields CIGS layers with substantially uniform Ga distribution. As can be seen from FIG. 4, the first step (Step I') of the process is deposition of a precursor film on a base, the precursor film including Cu, In and Ga. As an example, the amounts of Cu, In and Ga may be such that Cu/(In+Ga) molar ratio in the film may be in the range of 0.7-1.0, preferably in the range of 0.8-0.9, and the Ga/(Ga+In) molar ratio may be in the range of 0.1-0.5, preferably in the range of 0.2-0.35. The precursor film may be deposited on the base by a variety of techniques such as electrodeposition, evaporation, sputtering, ink deposition etc. The precursor film may include nano particles made of Cu and/or In and/or Ga and/or their mixtures and/or alloys. Alternately, the precursor film may include at least two sub-layers, each sublayer including at least one of Cu, In and Ga.

Referring back to FIG. 4, the second step (Step II') of the process involves a reaction step wherein the precursor film is reacted with Se species (selenization). Such reaction or selenization may be achieved in various ways. Typically, the reaction step may involve heating the precursor film to a temperature range of 200-500° C. in the presence of Se provided by sources such as solid or liquid Se, $H_2Se$ gas, Se vapors, etc., for periods ranging from 1 minute to 30 minutes. If the precursor film includes Se in addition to Cu, In and Ga, the annealing or the reaction step may be carried out in an inert atmosphere. In case Se vapor is used during reaction, the Se vapor may be generated by heating solid or liquid Se sources or by organometallic Se sources among others. To avoid segregation of Ga to the film/base interface, the Cu—In—Ga—Se reactions are not completed during this step. In other words, the precursor film is under-selenized leaving within the film binary and ternary phases such as Cu—Se, Ga—Se, In—Ga—Se, Cu—Ga, Cu—Ga—In, In—Ga, etc. This film obtained after Step II' is a selenized film.

The third step (Step III') of the process involves a reaction step wherein the precursor film already reacted with Se, i.e. the selenized film, is further reacted with S species (i.e. sulfurized). Such reaction may be achieved in various ways. Typically, the reaction step may involve heating the precursor film to a temperature range of 200-600° C. in the presence of S provided by sources such as solid or liquid S, $H_2S$ gas, S vapors, etc., for periods ranging from 1 minute to 60 minutes. The S vapor may be generated by heating solid or liquid S sources or by organometallic S sources, among others. During the reaction with S or sulfurization or sulfidation, the Ga species (such as Cu—Ga intermetallics, Ga—S species and Ga—In—S species, Cu—Ga—S species and Cu—In—Ga—S species) get distributed relatively uniformly (as shown in curve B of FIG. 2) through the layer. This is because reaction of Ga species with S is fast, unlike the reaction of Ga species with Se, which, as described before, is slow. As a result of the Step III' (sulfurization) of the process a sulfurized film is formed on the base, the sulfurized film including Cu, In, Ga, Se and S, wherein the Ga is distributed substantially uniformly through the thickness of the film.

The last step (Step IV') of the process in FIG. 4 is substantial replacement of S in the sulfurized film with Se. This is the "final selenization" step. To achieve final selenization, the sulfurized film of Step III' is exposed to Se species at elevated temperatures, preferably in the range of 250-600° C., more preferably in the range of 400-575° C., for a period of time which may be in the range of 1 minute to 1 hour, preferably in the range of 5 minutes to 30 minutes. As a result of the Step IV' of the process, the Cu—In—Ga—S species of the sulfurized film is converted into a $Cu(In,Ga)Se_2$ absorber layer while the substantially uniform distribution of Ga within the film is preserved yielding a distribution similar to that shown in curve B of FIG. 2. It should be noted that by adjusting the times and temperatures employed during Step IV' of the process, certain degree of S may be left in the absorber layer. The S/(S+Se) ratio in the final absorber layer may be less than 0.3, preferably less than 0.2, most preferably less than 0.1. Higher final selenization temperatures and/or longer final selenization times would replace more of the S within the sulfurized film with Se, thus yielding smaller S/(S+Se) ratio in the final absorber.

The processes of the present invention may be carried out in-line or roll-to-roll fashion, continuously, using apparatus described in U.S. patent application Ser. No. 11/549,590 filed Oct. 13, 2006 entitled "Method and Apparatus For Converting Precursor Layers Into Photovoltaic Absorbers, U.S. Provisional Appln. Ser. No. 60/862,164 filed Oct. 19, 2006 entitled "Roll-To-Roll Electroplating For Photovoltaic Film Manufacturing", and U.S. Provisional Appln. Ser. No. 60/865,385 filed Nov. 10, 2006 entitled "Reel-To-Reel Reaction of Precursor Film to Form Solar Cell Absorber". In such an approach, each portion of a base (such as a base in the form of a long web) travels from section to section of a reactor, getting exposed to pre-set temperatures and gas species in each section. For example, a portion of the base with a precursor film on it may first enter into a first section of a reactor where the reaction of the precursor film on that portion with S is carried out forming a sulfurized film. The portion then may travel to and enters a second section of the reactor where the sulfurized film may be reacted with Se species, i.e. selenized, at the second section of the reactor. By adding more sections to the reactor the process of FIG. 4 may also be carried out in a roll-to-roll or in-line manner.

Solar cells may be fabricated on the compound layers of the present invention using materials and methods well known in the field. For example a thin (<0.1 microns) CdS layer may be deposited on the surface of the compound layer using the chemical dip method. A transparent window of a transparent conductive oxide such as ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

What is claimed is:

1. A method of forming on a base, a $Cu(In,Ga)(S,Se)_2$ layer with substantially uniform Ga distribution, the method comprising;
   depositing a precursor film on the base, the precursor film including Cu, In and Ga,
   sulfurizing the precursor film with S thus forming a sulfurized precursor layer with a substantially uniform Ga distribution, wherein the sulfurizing causes reactions between the S and the Ga, thus creating various Ga—S phases that are distributed throughout the precursor film, and
   selenizing the sulfurized precursor layer with Se to reduce the sulfur concentration therein by replacing some of the S in the Ga—S phases with Se while maintaining the Ga as distributed throughout the precursor layer from the step of sulfurizing and thereby obtaining the $Cu(In,Ga)(S,Se)_2$ layer with substantially uniform Ga distribution therein.

2. The method according to claim 1 wherein the step of selenizing replaces most of the S in the sulfurized layer with Se so that the resulting S/(S+Se) molar ratio is less than 0.3.

3. The method according to claim 2 wherein the resulting S/(S+Se) molar ratio is less than 0.1.

4. The method according to claim 2 wherein the step of sulfurizing includes heating the precursor film to a temperature range of 200-600° C. in the presence of S.

5. The method according to claim 4 wherein the heating takes place for a period that ranges from one minute to one hour.

6. The method according to claim 5 wherein the step of sulfurizing results in a complete reaction with S that substantially forms ternary or quarternary compound phases of Cu—In—Ga—S.

7. The method according to claim 5 wherein the step of sulfurizing results in an incomplete reaction with S that forms binary, ternary or quarternary compound phases of S with Cu, In and Ga.

8. The method according to claim 4 wherein the step of selenizing includes heating the sulfurized precursor layer to a temperature range of 400-575° C. in the presence of Se.

9. The method according to claim 8 wherein the heating of the sulfurized precursor layer takes place for a period that ranges from one minute to one hour.

10. The method according to claim 9 wherein the resulting S/(S+Se) molar ratio is less than 0.1.

11. The method according to claim 1 further including a step of reacting after the step of depositing the precursor and before the step of sulfurizing, the step of reacting including reacting the precursor film with Se.

12. The method according to claim 11 wherein the step of reacting includes heating the precursor layer to a temperature range of 200-500° C. in the presence of Se.

13. The method according to claim 12 wherein the heating takes place for a period that ranges from one minute to thirty minutes.

14. The method according to claim 12 wherein the step of sulfurizing includes heating the precursor film to a temperature range of 200-600° C. in the presence of S.

15. The method according to claim 14 wherein the heating takes place for a period that ranges from one minute to one hour.

16. The method according to claim 12 wherein the step of heating results in an incomplete reaction with Se that forms binary, ternary or quarternary compound phases of Se with Cu, In and Ga.

17. The method according to claim 16 wherein the step of sulfurizing results in an incomplete reaction with S that forms binary, ternary or quarternary compound phases of S with Cu, In and Ga.

18. The method according to claim 14 wherein the step of selenizing includes heating the sulfurized precursor layer to a temperature range of 400-575° C. in the presence of Se.

19. The method according to claim 18 wherein the heating of the sulfurized precursor layer takes place for a period that ranges from one minute to one hour.

20. The method according to claim 19 wherein the resulting S/(S+Se) molar ratio is less than 0.1.

21. The method according to claim 1 wherein the precursor film further includes Se.

22. The method according to claim 21 wherein the Se/Cu molar ratio in the precursor layer is less than or equal to 1.6.

* * * * *